US008669690B2

(12) United States Patent
Ishii et al.

(10) Patent No.: US 8,669,690 B2
(45) Date of Patent: Mar. 11, 2014

(54) PIEZOLELECTRIC SOUND-GENERATING DEVICE

(75) Inventors: Shigeo Ishii, Takasaki (JP); Norikazu Sashida, Takasaki (JP); Yoshiyuki Watanabe, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 334 days.

(21) Appl. No.: 13/143,900

(22) PCT Filed: Jan. 26, 2010

(86) PCT No.: PCT/JP2010/051317

§ 371 (c)(1), (2), (4) Date: Jul. 8, 2011

(87) PCT Pub. No.: WO2010/087470

PCT Pub. Date: Aug. 5, 2010

(65) Prior Publication Data

US 2011/0285249 A1 Nov. 24, 2011

(30) Foreign Application Priority Data

Jan. 27, 2009 (JP) ................................ 2009-015065

(51) Int. Cl.
*H01L 41/047* (2006.01)

(52) U.S. Cl.
USPC ............ 310/334; 310/328; 310/332; 310/348

(58) Field of Classification Search
CPC ................................................... H01L 41/0926
USPC .......................... 310/328, 330, 332, 334, 348
See application file for complete search history.

(56) References Cited

U.S. PATENT DOCUMENTS

| | | | | |
|---|---|---|---|---|
| 6,653,762 | B2 * | 11/2003 | Takeshima | 310/340 |
| 6,741,710 | B1 | 5/2004 | Takeshima et al. | |
| 7,141,919 | B1 | 11/2006 | Hamada et al. | |
| 7,583,011 | B2 * | 9/2009 | Kami et al. | 310/348 |
| 2003/0011282 | A1 * | 1/2003 | Kishimoto | 310/324 |
| 2004/0218769 | A1 * | 11/2004 | Kami et al. | 381/189 |
| 2007/0108874 | A1 * | 5/2007 | Okazaki et al. | 310/348 |
| 2007/0228893 | A1 * | 10/2007 | Yamauchi et al. | 310/348 |
| 2009/0015108 | A1 * | 1/2009 | Ishimasa et al. | 310/353 |

FOREIGN PATENT DOCUMENTS

| | | | |
|---|---|---|---|
| JP | 2001-095094 | A | 4/2001 |
| JP | 2004-015768 | A | 1/2004 |
| JP | 2008-099221 | A | 4/2008 |
| WO | 2005/064989 | A | 7/2005 |
| WO | 2006-025138 | A | 1/2006 |
| WO | 2007/097077 | A | 8/2007 |

* cited by examiner

*Primary Examiner* — Derek Rosenau
*Assistant Examiner* — Bryan Gordon
(74) *Attorney, Agent, or Firm* — Law Office of Katsuhiro Arai

(57) ABSTRACT

Provided is a piezoelectric sound generating device capable of obtaining a stable connection state of lead-out conductors constituted of a conductive resin layer. A piezoelectric sound generating device 10, wherein lead-out conductors 18*a*, 18*b* are so flatly formed as to extend from surface electrodes 11*a*, 11*b*1 of a piezoelectric element 11 exposed to first openings 13*a*1, 13*b*1 to terminal electrodes 15*a*, 15*b* of a terminal portion 15 exposed to second openings 13*a*2, 13*b*2 on one main surface side of a diaphragm 12, respectively. As a result, the surface electrode 11*a*1 of the piezoelectric element 11 and the terminal electrode 15*a* of the terminal portion 15, and also the surface electrode 11*b*1 and a surface electrode 11*c* of the piezoelectric element 11, and the terminal electrode 15*b* of the terminal portion 15 are conductively connected. Hence, poor connection caused by cracks or the like is not likely to occur in the lead-out conductors.

9 Claims, 10 Drawing Sheets

PIEZOLELECTRIC SOUND-GENERATING DEVICE

This application is the U.S. National Phase under 35 U.S.C. §371 of International Application PCT/JP2010/051317, filed Jan. 26, 2010, which claims priority to Japanese Patent Application No. 2009-015065, filed Jan. 27, 2009. The International Application was published under PCT Article 21(2) in a language other than English.

TECHNICAL FIELD

The present invention relates to a piezoelectric sound-generating device of a square shape using a bimorph piezoelectric element.

BACKGROUND ART

Piezoelectric sound-generating bodies are used in receivers, speakers and other parts of slim electronic devices and mobile electronic devices. These piezoelectric sound-generating bodies are constituted, for example, by storing, in a cap-shaped resin case, etc., a piezoelectric vibration plate formed by adhesively attaching on the principle side of a vibration plate made of phosphor bronze, etc., a piezoelectric element having surface electrodes formed on both principle sides of a disk-shaped ceramic piezoelectric substance. In recent years, high sound pressures and improved space efficiencies are required for the aforementioned devices as LCD displays and organic EL displays, etc., have become larger. To meet this demand, piezoelectric sound-generating bodies using bimorph piezoelectric elements are proposed as a means for achieving larger amplitudes.

One example of the aforementioned bimorph piezoelectric elements is presented by Patent Literature 1, which is a piezoelectric electro-acoustic converter having a bimorph piezoelectric element 111 as shown in FIG. 15. To be specific, a layered body is formed by stacking two or three piezoelectric ceramic layers 111*d*1, 111*d*2. Surface electrodes 111*b*1, 111*b*2 are formed on the two principle sides of this layered body, and an internal electrode 111*a*2 is formed between the ceramic layers 111*d*1, 111*d*2. Furthermore, all ceramic layers 111*d*1, 111*d*2 are polarized in the same direction, or specifically in the thickness direction, as indicated by the bold arrow. When alternating signals are applied between the surface electrodes 111*b*1, 111*b*2 and internal electrode 111*a*2 in the directions indicated by the thin arrows and in the opposite directions, for example, the layered body as a whole generates bending vibration.

On the other hand, Patent Literature 2 proposes a square piezoelectric electro-acoustic converter 120 having a piezoelectric element 121, as shown in FIGS. 16 and 17. This converter 120 has a pair of terminals 125*a*, 125*b* whose inner connection parts are exposed on the inner surface of the side wall of a case 124 in a direction roughly vertical to the piezoelectric element 121, and the inner connection parts of the terminals 125*a*, 125*b* are electrically connected to the surface electrodes (not illustrated) of the piezoelectric element 121 by lead conductors 128*a*, 128*b* made of conductive adhesive.

Patent Literature 1: Japanese Patent Laid-open No. 2001-95094

Patent Literature 2: Japanese Patent Laid-open No. 2004-15768

SUMMARY OF THE INVENTION

Problems to be Solved by the Invention

In the latter piezoelectric electro-acoustic converter 120 described in "Prior Art" above, one end of the lead conductors 128*a*, 128*b* made of conductive adhesive are connected to the surface electrodes on one principle side of the piezoelectric element 121, from the surface of a vibration plate 122, in a manner passing over the thickness dimension of the piezoelectric element 121. Also, the other ends of the lead conductors 128*a*, 128*b* are connected to the inner connection parts of the terminals 125*a*, 125*b*, from the surface of the vibration plate 122, via the top surface of a seal 127 such as silicone resin seal and the step of the case 124. When conductive adhesive constituting the lead conductors 128*a*, 128*b* is formed this way in an alienating manner from the surface of the vibration plate 122 in the thickness direction, high tensile/compressive stresses are applied repeatedly to the inside of the layer of conductive adhesive constituting the lead conductors 128*a*, 128*b* when the vibration plate 122 generates flexural vibration due to driving of the piezoelectric element 121, as shown in FIG. 18. As a result, the lead conductors 128*a*, 128*b* made of conductive adhesive have a possibility of suffering from poor connection due to cracking C, etc. The object of the present invention is to provide a piezoelectric sound-generating device whose lead conductors made of conductive resin layer are resistant to poor connection due to cracking C, etc.

Means for Solving the Problems

To achieve the aforementioned object, one piezoelectric sound-generating device conforming to the present invention is (1) a piezoelectric sound-generating device of a square shape comprising:

a vibration plate having a main square area in which multiple first openings are formed, and multiple extension parts on which second openings are formed and which are projecting from the outer periphery of the main area;

a frame having a rim that circularly supports a vicinity of the continuous outer periphery of the main area and extension parts of the vibration plate, adhesively attached on one principle side of the vibration plate;

a square bimorph piezoelectric element having multiple surface electrodes formed in positions corresponding to the first openings on the one principle side of the vibration plate, adhesively attached in the main area on the other principle side of the vibration plate;

a terminal having an insulative substrate and terminal electrodes formed on one principle side of the substrate, adhesively attached on the other principle side of the extension parts of the vibration plate; and multiple lead conductors formed on the one principle side of the vibration plate, respectively, from the surface electrodes of the piezoelectric element exposed in the first openings, to the terminal electrodes of the terminal exposed in the second openings. (This is hereinafter referred to as the "first technical means of the present invention.")

The operation of the above first technical means is as follows. To be specific, on this piezoelectric sound-generating device of a square shape, the multiple lead conductors are formed on the one principle side of the vibration plate, respectively, from the surface electrodes of the square bimorph piezoelectric element exposed in the first openings in the main square area of the vibration plate, to the terminal electrodes of the terminal exposed in the second openings on the extension parts projecting from the main area of the vibration plate. This way, the surface electrodes of the piezoelectric elements are connected to the terminal electrodes of the terminal via the lead conductors.

Because of the above structure, the aforementioned lead conductors are formed roughly flat on the one principle side of the vibration plate. As a result, these lead conductors do not easily have thin parts regardless of the thickness dimension of the bimorph piezoelectric element. Consequently, the lead conductors are resistant to poor connection due to cracking, etc.

In addition, another key embodiment of the aforementioned piezoelectric sound-generating device is (2) one according to the above first technical means, wherein a first cover is also provided on the other principle side of the vibration plate in a manner covering the other principle side of the piezoelectric element while also forming a ventilation hole. (This is hereinafter referred to as the "second technical means of the present invention.")

The operation of the above second technical means is as follows. To be specific, existence of the first cover prevents the piezoelectric element from being damaged due to contact with the outside.

In addition, another key embodiment of the aforementioned piezoelectric sound-generating device is (3) one according to the above first or second technical means, wherein a second cover is also provided on the frame in a manner covering the one principle side of the vibration plate while also forming a ventilation hole. (This is hereinafter referred to as the "third technical means of the present invention.")

The operation of the above third technical means is as follows. To be specific, existence of the second cover prevents the vibration plate from being damaged due to contact with the outside.

In addition, another key embodiment of the aforementioned piezoelectric sound-generating device is (4) one according to the above first technical means, wherein the frame also has projections extending from the rim, with edges projecting into the area overlapping with the piezoelectric element across the vibration plate. (This is hereinafter referred to as the "fourth technical means of the present invention.")

The operation of the above fourth technical means is as follows. To be specific, because the frame has the projections the vibration of the vibration plate can be changed compared to when there are no projections, and consequently the frequency vs. sound pressure characteristics of the piezoelectric sound-generating device can be adjusted with ease.

In addition, another key embodiment of the aforementioned piezoelectric sound-generating device is (5) one according to the above first technical means, wherein the vibration plate is made of a rubber sheet. (This is hereinafter referred to as the "fifth technical means of the present invention.")

The operation of the above fifth technical means is as follows. To be specific, because the vibration plate is made of a rubber sheet, the first-order resonance frequency can be shifted to low-frequency ranges.

Effects of the Invention

According to a piezoelectric sound-generating device conforming to the present invention, lead conductors are resistant to poor connection due to cracking, etc. As a result, a piezoelectric sound-generating device offering stable connection condition can be provided. The aforementioned and other objects, configurations and characteristics, and operations and effects, of the present invention are explained below using attached drawings.

BRIEF DESCRIPTION OF THE DRAWINGS

FIG. 2(A) is an enlarged view of key parts in section A-A of FIG. 1 above, while FIG. 2(B) is an enlarged view of key parts in section B-B of FIG. 1 above.

DESCRIPTION OF THE SYMBOLS

Figure 1:
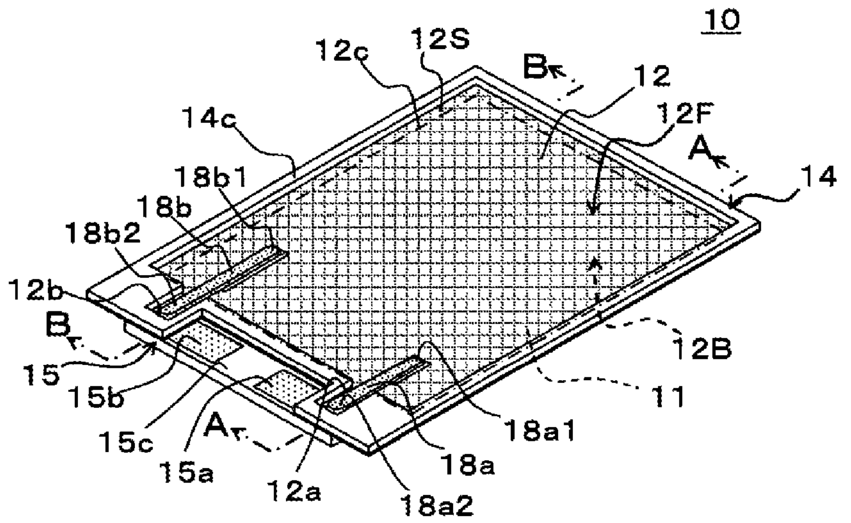
FIG. 1 is a perspective exterior view showing an overview of the first embodiment of a piezoelectric sound-generating device conforming to the present invention.
Figure 2:
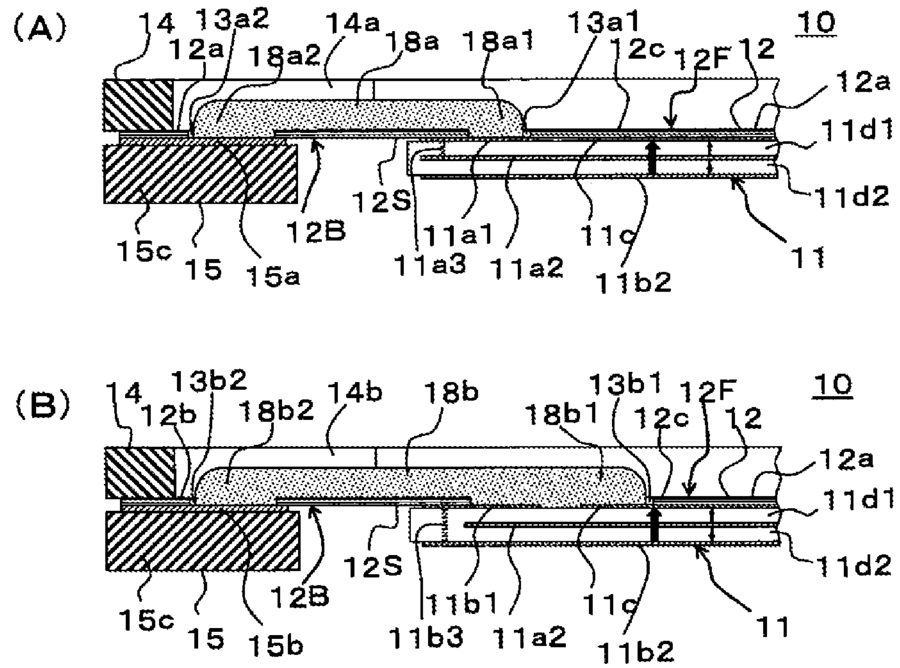
FIG. 2 is a figure showing an overview of the internal structure of the above embodiment, where

10, 20, 30, 40, 50 Piezoelectric sound-generating device
11, 41 Piezoelectric element
**11*a*1, 41*a*1** Surface electrode
**11*a*2, 41*a*2** Internal electrode

11a3, 41a3 Inter-layer connection part (through hole conductor)
11b1, 41b1 Surface electrode
11b2, 41b2 Surface electrode
11b3, 41b3 Inter-layer connection part (through hole conductor)
11c, 41c Surface electrode
11d1, 11d2, 41d1, 41d2 Piezoelectric layer
12, 42 Vibration plate
12S, 42S Main area
12a, 12b, 42a1, 42a2, 42b1, 42b2 Extension part
12c, 42c Area overlapping with piezoelectric element
12F, 42F One principle side
12B, 42B Other principle side
13a1, 13b1, 43a1, 43b1 First opening
13a2, 13b2, 43a2, 43b2 Second opening
14, 34, 44 Frame
14a, 14b, 44a, 44b Cutout
14c, 34c, 44c Rim
15, 45 Terminal
15a, 15b, 45a, 45b Terminal electrode
15c, 45c Substrate
18a, 48a Lead conductor
18b, 48b Lead conductor
26, 56 First cover
26a Second frame
26b Cover plate
26c Ventilation hole
27, 57 Second cover
27a, 27b, 57a, 57b Cutout
34d1, 34d2 Projection

MODE FOR CARRYING OUT THE INVENTION

The first embodiment of a piezoelectric sound-generating device conforming to the present invention is explained below by referring to FIGS. 1 to 4.

Figure 3:
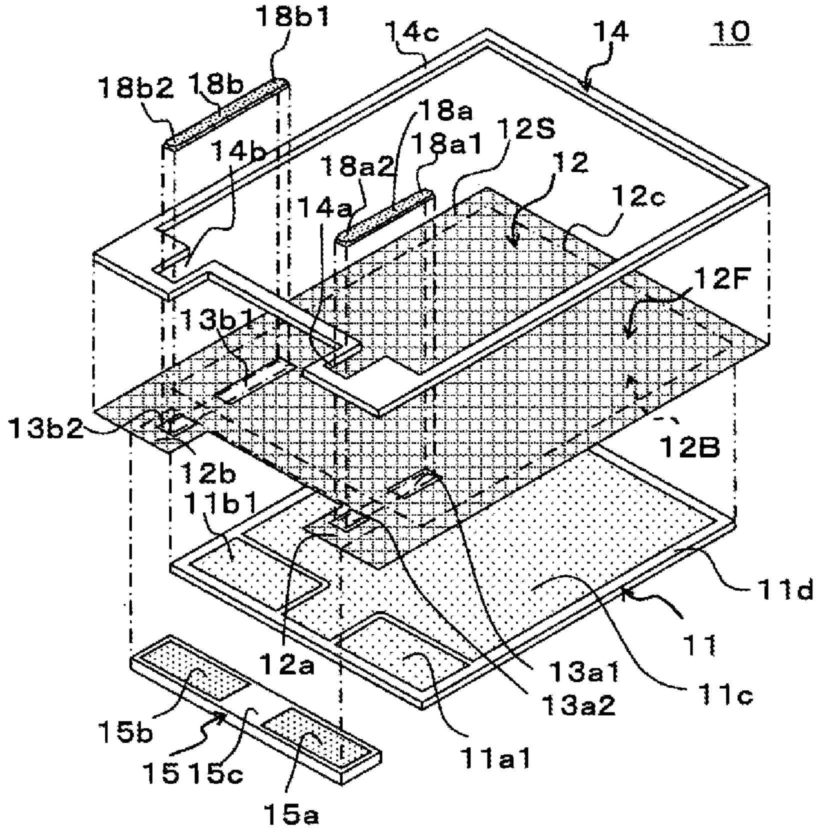
FIG. 3 is a perspective exploded view showing the internal structure of the above embodiment.

A piezoelectric sound-generating device 10 in this embodiment has a square shape on the outside, as shown in FIG. 1. As shown in FIG. 3, the constitution of the piezoelectric sound-generating device 10 is outlined by a vibration plate 12, a frame 14 adhesively attached on one principle side 12F of the vibration plate 12, a piezoelectric element 11 adhesively attached on the other principle side 12B of the vibration plate 12, a terminal 15 adhesively attached on the other principle side 12B of the vibration plate 12, and multiple lead conductors 18a, 18b formed on the one principle side 12F of the vibration plate 12.

The vibration plate 12 has a main square area 12S in which multiple first openings 13a1, 13b1 are formed, and multiple extension parts 12a, 12b projecting toward the outer periphery from one side of the main area 12S. The extension parts 12a, 12b have second openings 13a2, 13b2 formed on them, respectively.

The frame 14 has a rim 14c that circularly supports a vicinity of the continuous outer periphery of the main area 12S and extension parts 12a, 12b of the vibration plate 12 and is adhesively attached on the one principle side 12F of the vibration plate 12. The frame 14 has cutouts 14a, 14b formed in positions corresponding to the second openings 13a2, 13b2 on the extension parts 12a, 12b of the vibration plate 12, respectively.

The piezoelectric element 11 has multiple surface electrodes 11a1, 11b1, 11c formed in positions corresponding to the first openings 13a1, 13b1 on the one principle side of the vibration plate 12, and is adhesively attached in the main area 12S on the other principle side 12B of the vibration plate 12. It is of bimorph type and has a square shape on the outside.

Figure 4:
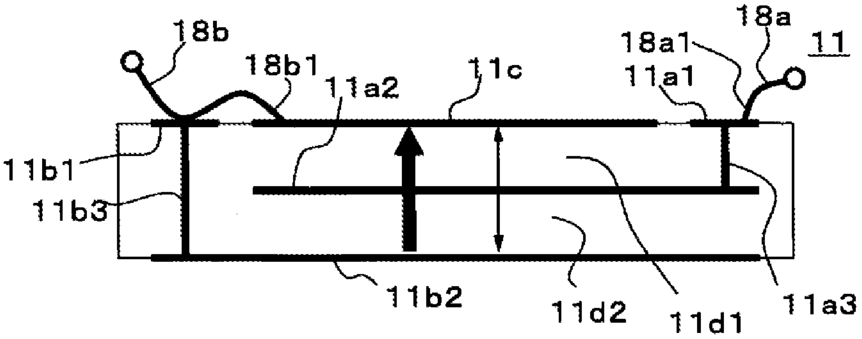
FIG. 4 is a schematic section view showing the internal structure of the piezoelectric element used in the above embodiment.

As shown schematically in FIG. 4, the internal structure of the piezoelectric element 11 is such that there are multiple piezoelectric layers 11d1, 11d2 made of piezoelectric ceramics. The surface electrode 11a1 on the one principle side is conductively connected to an internal electrode 11a2 provided between the first piezoelectric layer 11d1 and second piezoelectric layer 11d2 via an inter-layer connection part 11a3 such as a through hole conductor penetrating through the first piezoelectric layer 11d1 in the thickness direction, a side electrode, etc. The surface electrode 11b1 on the one principle side is conductively connected to the surface electrode 11b2 on the other principle side of the piezoelectric element 11 via an inter-layer connection part 11b3 such as a through hole conductor penetrating through the first piezoelectric layer 11d1 and second piezoelectric layer 11d2 in the thickness direction, a side electrode, etc.

All of the above piezoelectric layers 11d1, 11d2 are polarized in the same direction, or specifically in the thickness direction, as indicated by the bold arrow.

The terminal 15 has an insulative substrate 15c and multiple terminal electrodes 15a, 15b formed on one principle side of the substrate 15c, and is adhesively attached on the other principle side of the extension parts 12a, 12b of the vibration plate 12. In this embodiment, the terminal 15 bridges one extension part 12a and the other extension part 12b of the vibration plate 12, with both ends adhesively attached on the other principle side 12B of the vibration plate 12, respectively.

The multiple lead conductors 18a, 18b are formed on the one principle side 12F of the vibration plate 12, respectively, from the surface electrodes 11a1, 11c of the piezoelectric element 11 exposed in the first openings 13a1, 13b1 formed in the main square area 12S of the vibration plate 12, to the terminal electrodes 15a, 15b of the terminal 15 exposed in the second openings 13a2, 13b2 formed on the extension parts 12a, 12b of the vibration plate 12.

In this embodiment, the lead conductors 18a, 18b are provided on one side of the piezoelectric sound-generating device 10, in parallel with each other, in a manner sandwiching the terminal 15.

The one lead conductor 18a is formed from the main area 12S on the one principle side 12F of the vibration plate 12 to the extension part 12a, as shown in FIG. 2(A). One end 18a1 of it is connected to the surface electrode 11a1 of the piezoelectric element 11 exposed in the first opening 13a1 as formed in the main square area 12S of the vibration plate 12, while the other end 18a2 is connected to the terminal electrode 15a of the terminal 15 exposed in the second opening 13a2 as formed on the extension part 12a of the vibration plate 12.

The other lead conductor 18b is formed from the main area 12S on the one principle side 12F of the vibration plate 12 to the extension part 12b, as shown in FIG. 2(B). The lead conductor 18b is longer than the lead conductor 18a. Also, one end 18b1 of it is connected to the surface electrodes 11b1, 11c of the piezoelectric element 11 exposed in the first opening 13b1 on the vibration plate 12, while the other end 18b2 is connected to the terminal electrode 15b of the terminal 15 exposed in the second opening 13b2 as formed on the extension part 12b of the vibration plate 12.

The other end 18a2 of the one lead conductor 18a is stored in the cutout 14a formed in the frame 14, and its periphery is guided by the frame 14. Similarly, the other end 18b2 of the other lead conductor 18b is stored in the cutout 14b formed in the frame 14, and its periphery is guided by the frame 14.

Accordingly, the piezoelectric sound-generating device 10 in this embodiment provides flat lead conductors 18*a*, 18*b* along the one principle side 12F of the vibration plate 12, regardless of the thickness dimension of the square bimorph piezoelectric element 11, and consequently achieves a stable connection condition.

Figure 5:
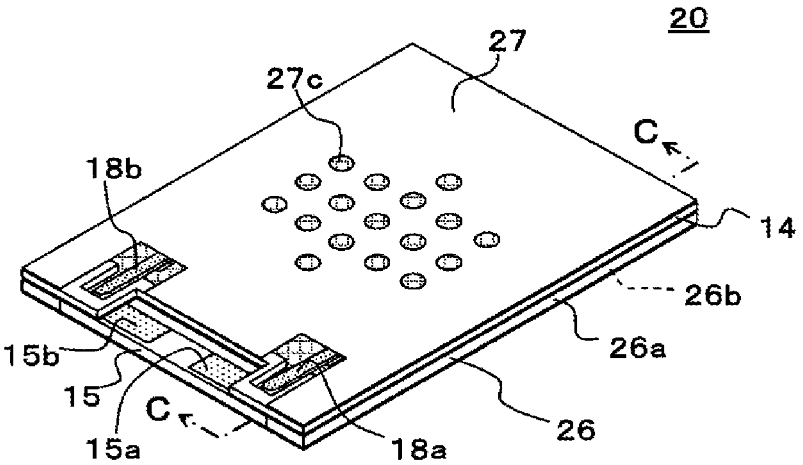
FIG. 5 is a perspective exterior view showing an overview of the second embodiment of a piezoelectric sound-generating device conforming to the present invention.
Figure 6:
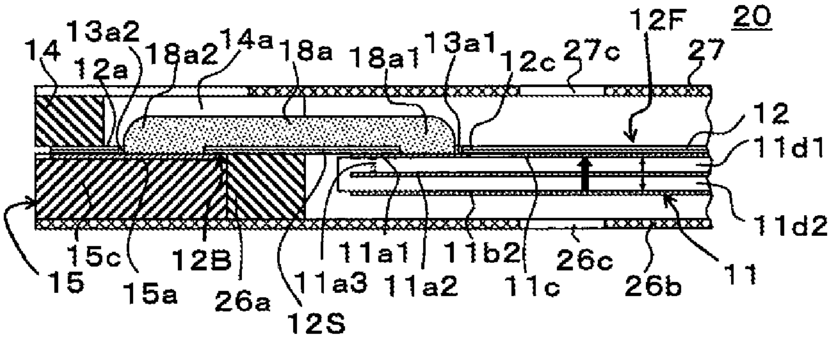
FIG. 6 is an enlarged view of key parts in section C-C of FIG. 5 above, showing an overview of the internal structure of the above embodiment.

Next, the second embodiment of a piezoelectric sound-generating device conforming to the present invention is explained below by referring to FIGS. 5 to 7.

Figure 7:
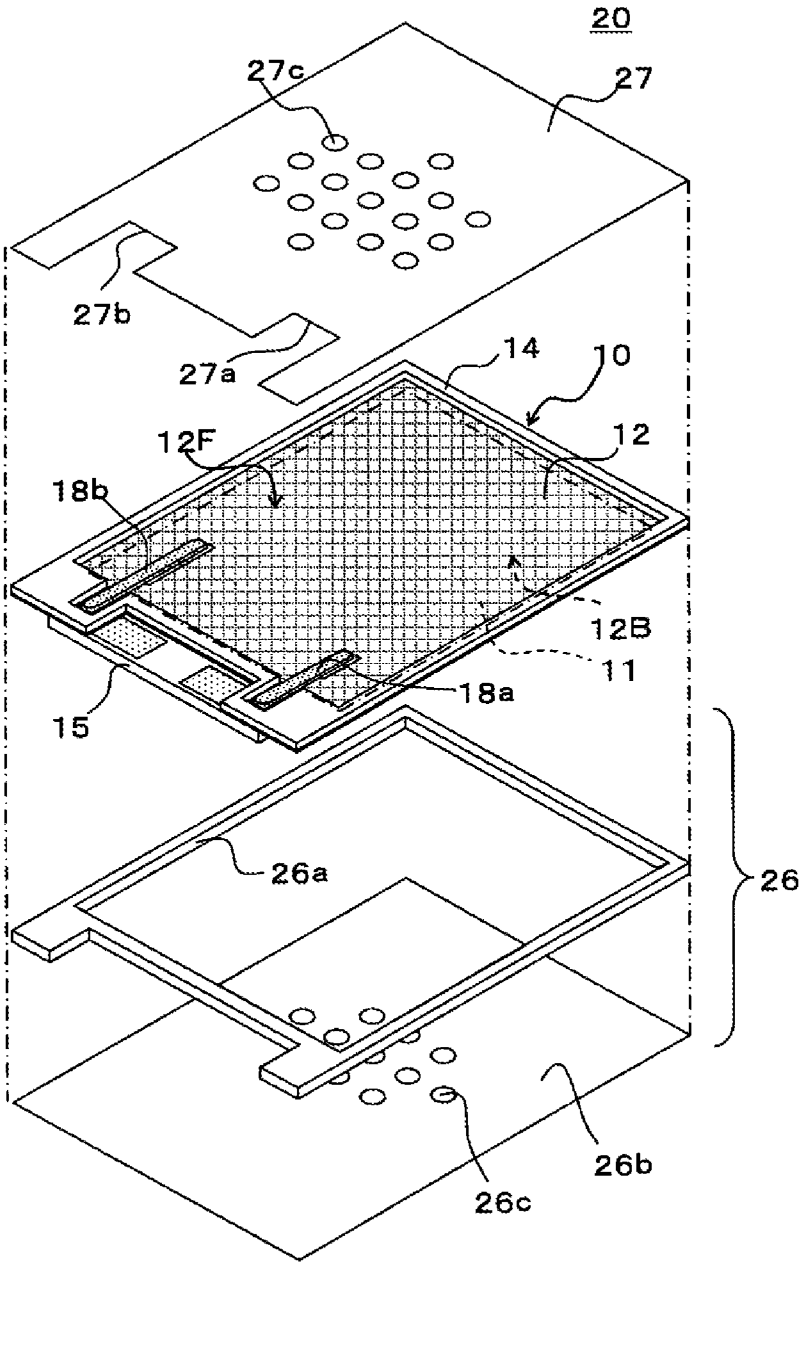
FIG. 7 is a perspective exploded view showing the internal structure of the above embodiment.

As evident from FIG. 7, a piezoelectric sound-generating device 20 in this embodiment, while conforming to the constitution of the piezoelectric sound-generating device 10 in the first embodiment, also has a first cover 26 provided on the other principle side 12B of the vibration plate 12 in a manner covering the other principle side of the piezoelectric element 11 while also forming a ventilation hole 26*c*. The first cover 26 is constituted by a second frame 26*a* surrounding the periphery of the piezoelectric element 11, and a cover plate 26*b* adhesively attached on the second frame 26*a* in a manner covering the other principle side of the piezoelectric element 11, where multiple ventilation holes 26*c* are formed in the cover plate 26*b*. Accordingly, the piezoelectric sound-generating device 20 in this embodiment can prevent the piezoelectric element 11 from being damaged due to contact with the outside.

In addition, the piezoelectric sound-generating device 20 in this embodiment, while conforming to the constitution of the piezoelectric sound-generating device 10 in the first embodiment, also has a second cover 27 provided on the frame 14 in a manner covering the one principle side 12F of the vibration plate 12 while also forming a ventilation hole 27*c*. The second cover 27 has cutouts 27*a*, 27*b* formed in positions respectively corresponding to the lead conductors 18*a*, 18*b*. Accordingly, the piezoelectric sound-generating device 20 in this embodiment can prevent the vibration plate 12 from being damaged due to contact with the outside.

Figure 8:
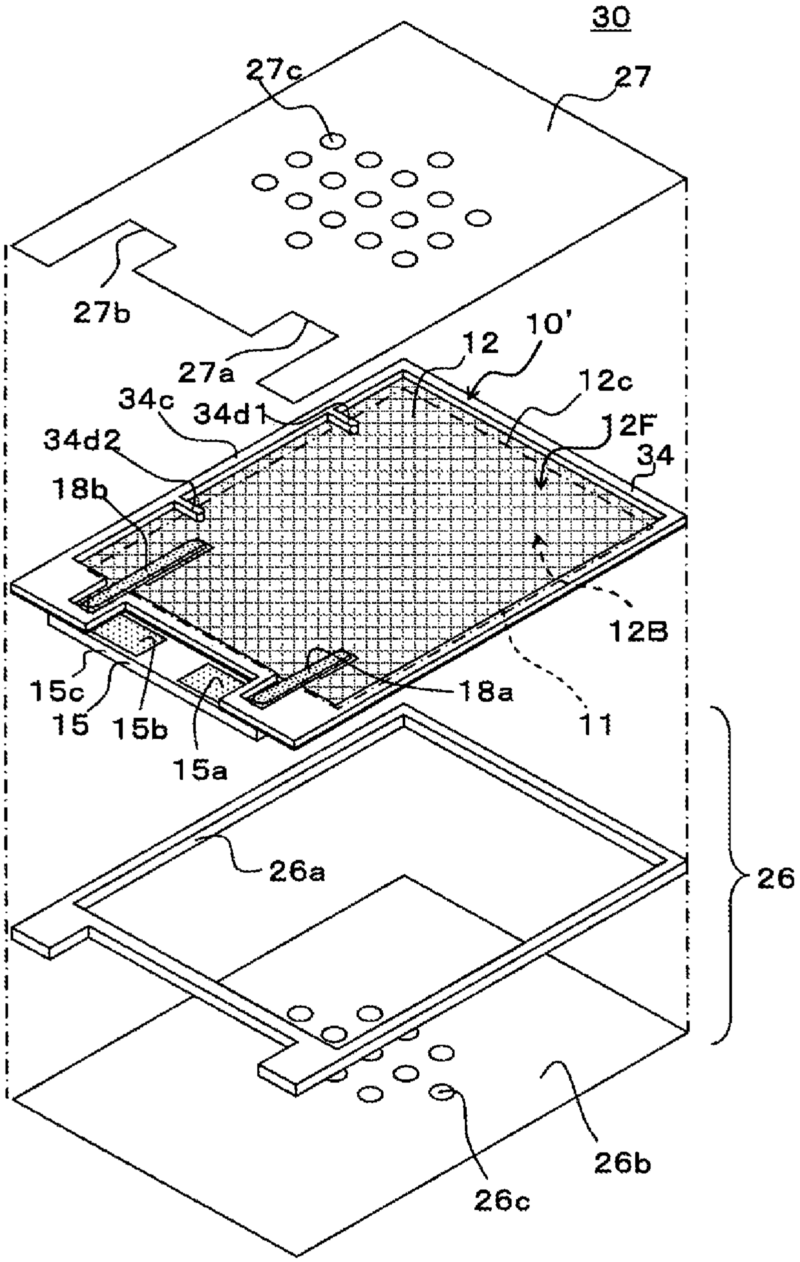
FIG. 8 is a perspective exploded view showing the internal structure of the third embodiment of a piezoelectric sound-generating device conforming to the present invention.
Figure 9:
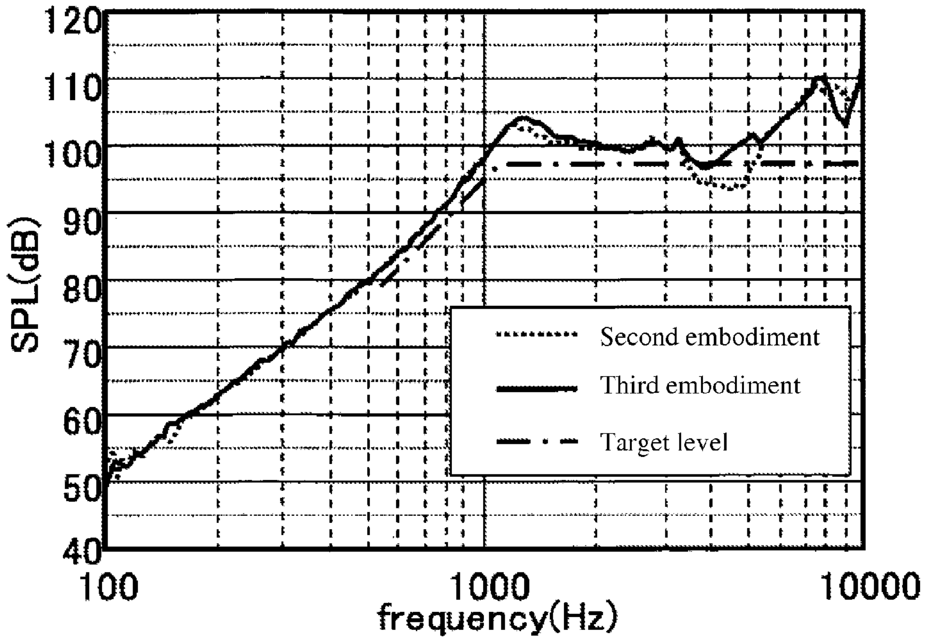
FIG. 9 is a graph showing the sound pressure characteristics of the piezoelectric sound-generating bodies in the above second and third embodiments.

Next, the third embodiment of a piezoelectric sound-generating device conforming to the present invention is explained below by referring to FIGS. 8 and 9.

A piezoelectric sound-generating device 30 in this embodiment is the same as the piezoelectric sound-generating device 20 in the second embodiment, except that a frame 34 is used instead of the frame 14. The frame 34 of the piezoelectric sound-generating device 30 in this embodiment has projections 34*d*1, 34*d*2 extending from a rim 34*c* of the frame 34, with edges projecting into an area 34*c* overlapping with the piezoelectric element 11 across the vibration plate 12. Accordingly, the piezoelectric sound-generating device 30 in this embodiment allows the vibration of the vibration plate to be changed compared to when there are no projections. In FIG. 9, the horizontal axis represents frequency, while the vertical axis represents sound pressure level. Here, the alternately long and short dashed line represents the target level of acoustic characteristics desirable for mobile phone speakers. The dotted line represents the sound pressure characteristics of the piezoelectric sound-generating device 20 in the second embodiment, while the solid line represents the sound pressure characteristics of the piezoelectric sound-generating device 30 in the third embodiment. As evident from FIG. 9, the sound pressure drops near 4500 Hz with the piezoelectric sound-generating device 20 in the second embodiment, but it improves to the target level or above with the piezoelectric sound-generating device 30 in the third embodiment having the projections 34*d*1, 34*d*2 on the frame 34.

Next, the fourth embodiment of a piezoelectric sound-generating device conforming to the present invention is explained below by referring to FIGS. 10 and 12.

A piezoelectric sound-generating device 40 in this embodiment has a different terminal electrode layout compared to the piezoelectric sound-generating device 10 in the first embodiment explained earlier. In the piezoelectric sound-generating device 10 in the first embodiment, the multiple terminal electrodes 15*a*, 15*b* are provided adjacent to each other on one side of the piezoelectric sound-generating device of a square shape 10. The piezoelectric sound-generating device 40 in this embodiment, on the other hand, has its terminal electrodes 45*a*, 45*b* provided at the centers of two opposing sides.

Figure 10:
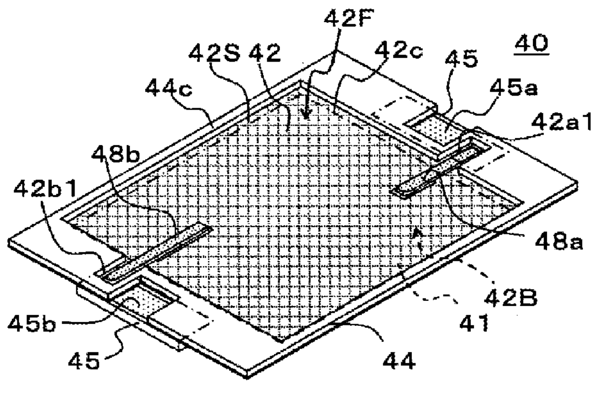
FIG. 10 is a perspective exterior view showing an overview of the fourth embodiment of a piezoelectric sound-generating device conforming to the present invention.
Figure 11:
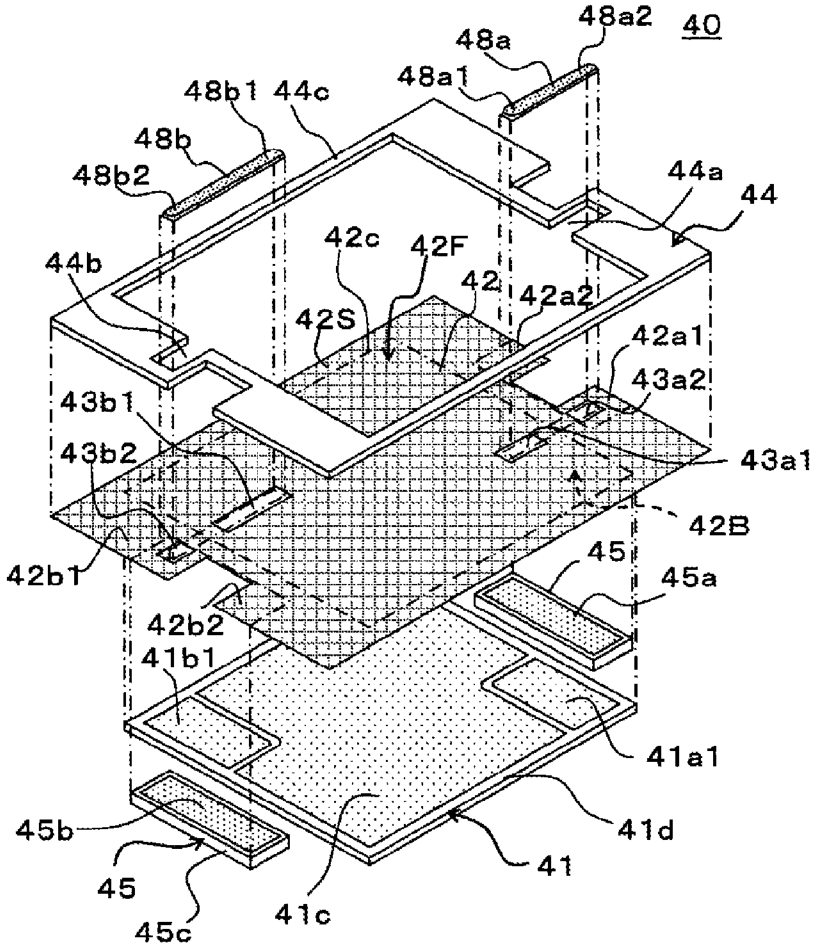
FIG. 11 is a perspective exploded view showing the internal structure of the above embodiment.

To be specific, the piezoelectric sound-generating device 40 in this embodiment has a square shape on the outside, as shown in FIG. 10. As shown in FIG. 11, its constitution is outlined by a vibration plate 42, a frame 44 adhesively attached on one principle side 42F of the vibration plate 42, a piezoelectric element 41 adhesively attached on the other principle side 42B of the vibration plate 42, a pair of terminals 45, 45 adhesively attached on the other principle side 42B of the vibration plate 42, and multiple lead conductors 48*a*, 48*b* formed on the one principle side 42F of the vibration plate 42.

The vibration plate 42 has a main square area 42S in which multiple first openings 43*a*1, 43*b*1 are formed, and multiple extension parts 42*a*1, 42*a*2, 42*b*1, 42*b*2 projecting toward the outer periphery from two opposing sides of the main area 42S. The extension parts 42*a*1, 42*b*1 have second openings 43*a*2, 43*b*2 formed on them, respectively.

The frame 44 has a rim 44*c* that circularly supports a vicinity of the continuous outer periphery of the main area 42S and extension parts 42*a*1, 42*a*2, 42*b*1, 42*b*2 of the vibration plate 42 and is adhesively attached on the one principle side 42F of the vibration plate 42. The frame 44 has cutouts 44*a*, 44*b* formed in positions corresponding to the second openings 43*a*2, 43*b*2 on the extension parts 42*a*1, 42*b*1 of the vibration plate 42, respectively.

The piezoelectric element 41 has multiple surface electrodes 41*a*1, 41*b*1, 41*c* formed in positions corresponding to the first openings 43*a*1, 43*b*1 on the one principle side of the vibration plate 42, and is adhesively attached in the main area 42S on the other principle side 42B of the vibration plate 42. It is of bimorph type and has a square shape on the outside.

Figure 12:
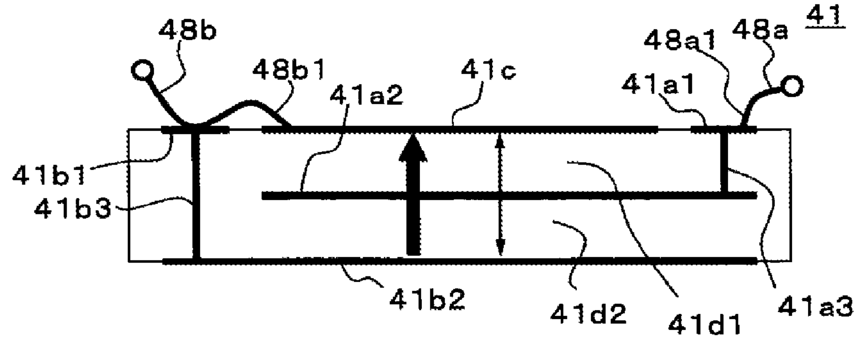
FIG. 12 is a schematic section view showing the internal structure of the piezoelectric element used in the above embodiment.

As shown schematically in FIG. 12, the internal structure of the piezoelectric element 41 is such that there are multiple piezoelectric layers 41*d*1, 41*d*2 made of piezoelectric ceramics. The surface electrode 41*a*1 on the one principle side is conductively connected to an internal electrode 41*a*2 provided between the first piezoelectric layer 41*d*1 and second piezoelectric layer 41*d*2 via an inter-layer connection part 41*a*3 such as a through hole conductor penetrating through the first piezoelectric layer 41*d*1 in the thickness direction, a side electrode, etc. The surface electrode 41*b*1 on the one principle side is conductively connected to a surface electrode 41*b*2 on the other principle side of the piezoelectric element 41 via an inter-layer connection part 41*b*3 such as a through hole conductor penetrating through the first piezoelectric layer 41*d*1 and second piezoelectric layer 41*d*2 in the thickness direction, a side electrode, etc.

All of the above piezoelectric layers 41*d*1, 41*d*2 are polarized in the same direction, or specifically in the thickness direction, as indicated by the bold arrow.

The terminals 45, 45 have an insulative substrate 45*c* and terminal electrodes 45*a*, 45*b* formed on one principle side of the substrate 45*c*, respectively, and are adhesively attached on the other principle side of the extension parts 42*a*1, 42*a*2, 42*b*1, 42*b*2 of the vibration plate 42. In this embodiment, each terminal 45 bridges one extension part 42*a*1 and the other extension part 42*a*2 on one of the two opposing sides of the main square area 42S of the vibration plate 42, or one extension part 42_b_1 and the other extension part 42_b_2 on the other side of the two opposing sides, with both ends adhesively attached on the other principle side 42B of the vibration plate 42, respectively.

The multiple lead conductors 48_a_, 48_b_ are formed on the one principle side 42F of the vibration plate 42, respectively, from the surface electrodes 41_a_1, 41_c_ of the piezoelectric element 41 exposed in the first openings 43_a_1, 43_b_1 formed in the main square area 42S of the vibration plate 42, to the terminal electrodes 45_a_, 45_b_ of the terminal 45 exposed in the second openings 43_a_2, 43_b_2 formed on the extension parts 42_a_1, 42_b_1 of the vibration plate 42.

In this embodiment, the lead conductors 48_a_, 48_b_ are provided on two opposing sides of the piezoelectric sound-generating device of a square shape 40, in parallel with each other and adjacent to the respective terminals 45, 45.

The one lead conductor 48_a_ is formed from the main area 42S on the one principle side 42F of the vibration plate 42 to the extension part 42_a_1, as shown in FIG. 11. One end 48_a_1 of it is connected to the surface electrode 41_a_1 of the piezoelectric element 41 exposed in the first opening 43_a_1 as formed in the main square area 42S of the vibration plate 42, while the other end 48_a_2 is connected to the terminal electrode 45_a_ of the terminal 45 exposed in the second opening 43_a_2 as formed on the extension part 42_a_1 of the vibration plate 42.

The other lead conductor 48_b_ is formed from the main area 42S on the one principle side 42F of the vibration plate 42 to the extension part 42_b_. The lead conductor 48_b_ is longer than the lead conductor 48_a_. Also, one end 48_b_1 of it is connected to the surface electrodes 41_b_1, 41_c_ of the piezoelectric element 41 exposed in the first opening 43_b_1 on the vibration plate 42, while the other end 48_b_2 is connected to the terminal electrode 45_b_ of the terminal 45 exposed in the second opening 43_b_2 as formed on the extension part 42_b_1 of the vibration plate 42.

The other end 48_a_2 of the one lead conductor 48_a_ is stored in the cutout 44_a_ formed in the frame 44, and its periphery is guided by the frame 44. Similarly, the other end 48_b_2 of the other lead conductor 48_b_ is stored in the cutout 44_b_ formed in the frame 44, and its periphery is guided by the frame 44.

Accordingly, the piezoelectric sound-generating device 40 in this embodiment provides flat lead conductors 48_a_, 48_b_ along the one principle side 42F of the vibration plate 42, regardless of the thickness dimension of the square bimorph piezoelectric element 41, and consequently achieves a stable connection condition.

Figure 13:
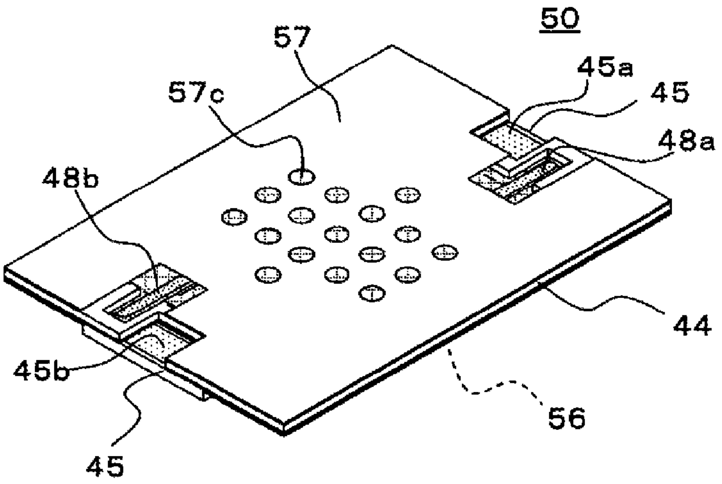
FIG. 13 is a perspective exterior view showing an overview of the fifth embodiment of a piezoelectric sound-generating device conforming to the present invention.

Next, the fifth embodiment of a piezoelectric sound-generating device conforming to the present invention is explained below by referring to FIGS. 13 and 14.

Figure 14:
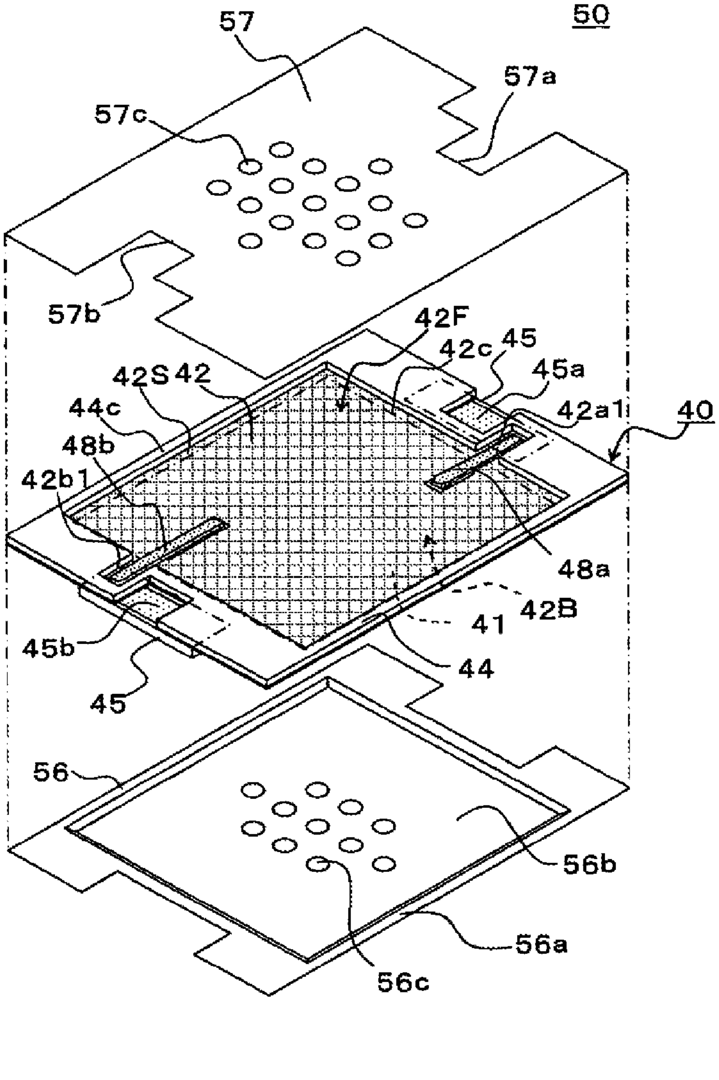
FIG. 14 is a perspective exploded view showing the internal structure of the above embodiment.
Figure 15:
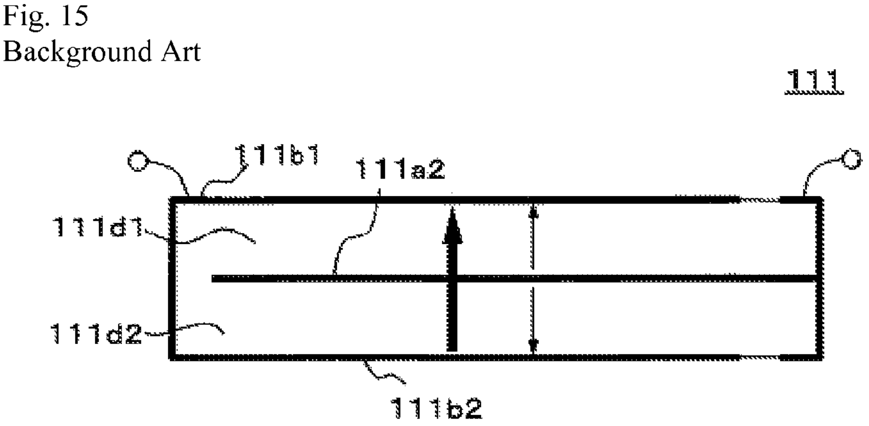
Fig. 15 Background Art
FIG. 15 is a schematic section view showing the internal structure of an example of bimorph piezoelectric element conforming to prior art.
Figure 16:
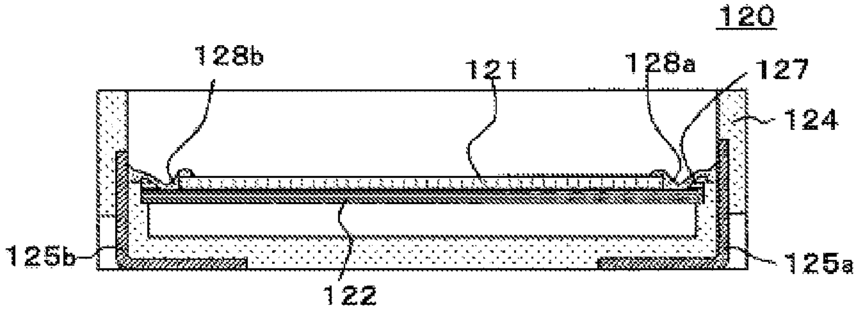
Fig. 16 Background Art
FIG. 16 is a section view showing an overview of the internal structure of an example of piezoelectric electro-acoustic converter conforming to prior art.
Figure 17:
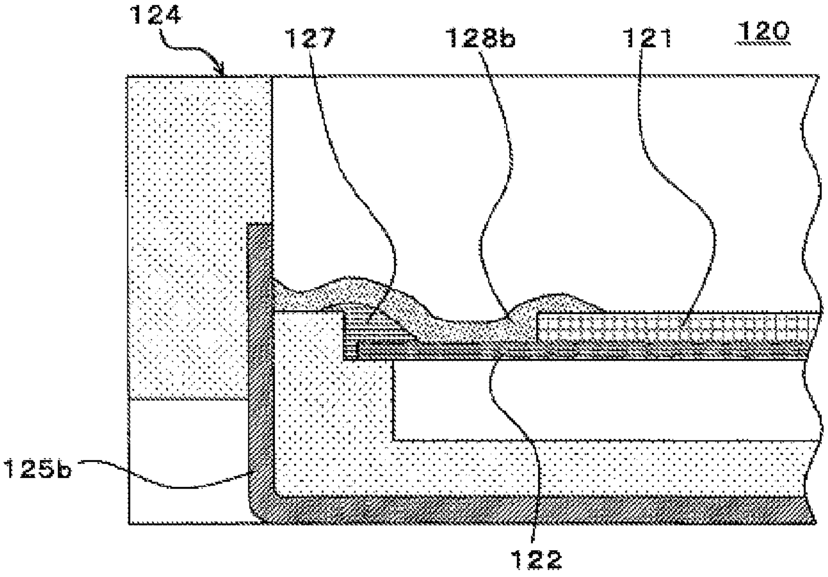
Fig. 17 Background Art
FIG. 17 is an enlarged section view of key parts, showing the internal structure of a piezoelectric electro-acoustic converter conforming to prior art.
Figure 18:
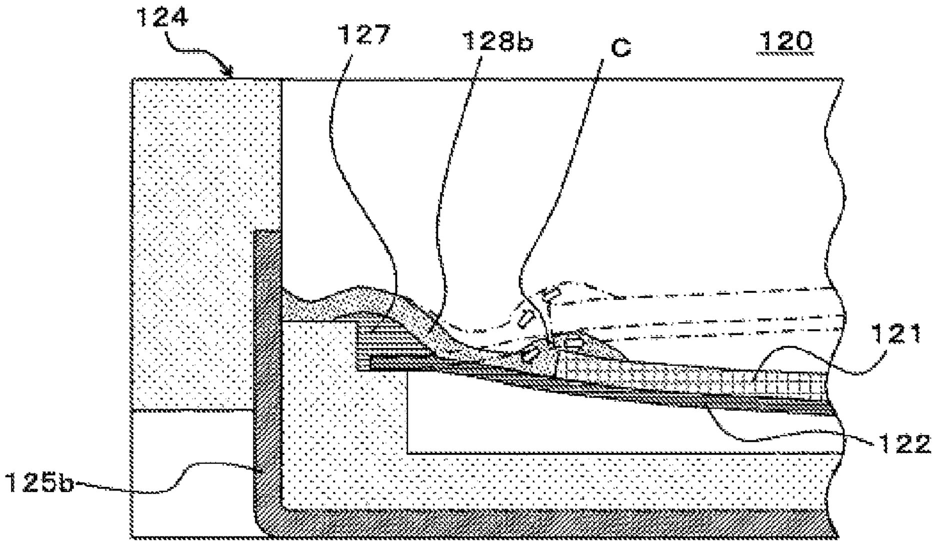
Fig. 18 Background Art
FIG. 18 is an enlarged section view of key parts, explaining the driving condition of the aforementioned piezoelectric electro-acoustic converter conforming to prior art.

As is evident from FIG. 14, a piezoelectric sound-generating device 50 in this embodiment, while conforming to the constitution of the piezoelectric sound-generating device 40 in the fourth embodiment, also has a first cover 56 provided on the other principle side 42B of the vibration plate 42 in a manner covering the other principle side of the piezoelectric element 41 while also forming a ventilation hole 56_c_. The first cover 56 is formed by drawing of an Al or other metal plate, etc., and constituted by a second rim 56_a_ surrounding the periphery of the piezoelectric element 41 and a cover part 56_b_ formed integrally with the rim 56_a_ in a manner covering the other principle side of the piezoelectric element 41, where multiple ventilation holes 56_c_ are formed in the cover part 56_b_. Accordingly, the piezoelectric sound-generating device 50 in this embodiment can prevent the piezoelectric element 41 from being damaged due to contact with the outside.

In addition, the piezoelectric sound-generating device 50 in this embodiment, while conforming to the constitution of the piezoelectric sound-generating device 40 in the fourth embodiment, also has a second cover 57 provided on the frame 44 in a manner covering the one principle side 42F of the vibration plate 42 while also forming a ventilation hole 57_c_. The second cover 57 has cutouts 57_a_, 57_b_ formed in positions respectively corresponding to the lead conductors 48_a_, 48_b_ and terminal electrodes 45_a_, 45_b_. Accordingly, the piezoelectric sound-generating device 50 in this embodiment can prevent the vibration plate 42 from being damaged due to contact with the outside.

Next a favorable embodiment of each part of a piezoelectric sound-generating device conforming to the present invention is explained.

First, the piezoelectric elements should desirably be comprised of piezoelectric layers and an internal electrode that are layered alternately and sintered integrally. Also, the surface electrodes on the principle side of the piezoelectric element should desirably be formed simultaneously with the internal electrode. Note, however, that the present invention is not limited to the foregoing in any way, and surface electrodes may also be formed by, for example, alternately layering and integrally sintering piezoelectric layers and an internal electrode and then applying electrode paste on its surface, followed by baking, etc.

Also note that, while the aforementioned embodiments show examples of a bimorph piezoelectric element constituted by a total of two piezoelectric layers including one on each side, the present invention is not limited to the foregoing in any way and various variations may be permitted as long as a bimorph piezoelectric element having multiple surface electrodes is used. For example, a bimorph piezoelectric element having an odd number of layers (such as three layers) on each side may be used.

Next, a favorable embodiment of the above piezoelectric layer is as follows. To be specific, the above piezoelectric layer should ideally be made of piezoelectric ceramics such as $PbZr_xTi_{1-x}O_3$ (PZT). It may also be made of so-called lead-free piezoelectric ceramics not containing lead.

The above piezoelectric layer is formed by, for example, mixing material powder of the aforementioned piezoelectric ceramics with organic solvent, binder, plasticizer, dispersant, etc., at specific ratios to prepare a slurry and then creating a ceramic green sheet using any known method such as the doctor blade method, after which the obtained sheet is layered with the surface electrodes and internal electrode explained later and then binder is removed at 500° C. in atmosphere, followed by integral sintering at, for example, 1000° C. in atmosphere. Note that the method is not limited to the doctor blade method in any way, and it is also possible to use the so-called slurry build method, for example, where a slurry containing material powder of piezoelectric ceramics just like the slurry mentioned above is printed/layered alternately with conductive paste containing internal electrode material, which is then followed by integral sintering in the same manner as explained above.

Next, a favorable embodiment of the above surface electrodes and internal electrode is as follows. To be specific, favorable examples of the above surface electrodes and internal electrode are Ag and Ag—Pd alloy. However, the material is not limited to the foregoing in any way, and any one of Au, Pt, Pd and Au—Pd alloy may be used. The thickness of the above surface electrodes and internal electrode may be 2 μm, for example.

Next a favorable embodiment of the above inter-layer connection conductor is as follows. To be specific, the above inter-layer connection conductor should ideally be a through hole conductor formed in a manner penetrating the aforementioned piezoelectric layer in the thickness direction, or a side electrode printed on the side face of the aforementioned piezoelectric layer.

Next, a favorable embodiment of the above vibration plate is as follows. To be specific, the above vibration plate should ideally be made of a rubber insulating sheet, such as a rubber sheet constituted by polyurethane rubber, silicone rubber, chloroprene rubber, other synthetic rubber, or the like. The thickness of the above vibration plate may be 50 to 150 μm, for example. The above vibration plate should ideally have an adhesive layer applied/formed at least on the side where the above piezoelectric element is adhesively attached.

Next, a favorable embodiment of the above frame is as follows. To be specific, the above frame should ideally be an insulative film made of polybutylene terephthalate (PBT), polyethylene terephthalate (PET), liquid crystal polymer, or the like. The thickness of the above frame may be 150 to 250 μm, for example.

Next, a favorable embodiment of the above terminal is as follows. To be specific, the above terminal should ideally be an insulative substrate made of polyethylene terephthalate (PET), liquid crystal polymer, etc., on which terminal electrodes are formed by means of Cu foil etching, etc. However, the terminal is not limited to the foregoing in any way, and it is also possible to, for example, apply conductive resin paste by means of screen printing, etc., and then curing the paste to form terminal electrodes. The thickness of the above terminal electrode may be 7 to 10 μm, for example.

Next, a favorable embodiment of the above lead conductors is as follows. To be specific, the above lead conductors should ideally be made of a conductive resin layer produced by mixing powder of metal, carbon, etc., with polyester resin, for example, where a favorable production method is applying and then curing conductive resin paste. The thickness of the above lead conductors may be 100 to 150 μm, for example.

Next, a favorable embodiment of the above first cover is as follows. To be specific, the above first cover should ideally be constituted by a second frame and cover plate, for example. As with the above frame, ideally the above second frame should also be an insulative film made of polybutylene terephthalate (PBT), polyethylene terephthalate (PET), liquid crystal polymer, or the like. The thickness of the above second frame may be 188 μm, for example.

Note that the first cover is not limited to the foregoing in any way, and it is also possible to draw or otherwise process an Al or other metal plate, and then use the obtained plate to integrally form the second rim and cover part.

Next, a favorable embodiment of the above second cover is as follows. To be specific, the above second cover should ideally be an insulative film made of polybutylene terephthalate (PBT), polyethylene terephthalate (PET), liquid crystal polymer, etc., or Al or other metal plate. The thickness of the above second cover may be 150 to 250 μm, for example.

Example 1

Next, an example of a piezoelectric sound-generating device conforming to the present invention is explained by referring to FIGS. 3 and 7 according to the second embodiment.

First, a vibration plate 12 of 100 μm in thickness was prepared, wherein such plate was constituted by a rubber sheet having an adhesive layer (not illustrated) formed on the principle side 12B where a piezoelectric element 11 was to be adhesively attached, as well as first openings 13*a*1, 13*b*1 and second openings 13*a*2, 13*b*2 formed in specified positions. Also, a 188-μm thick sheet made of polyethylene terephthalate (PET), also having an adhesive layer (not illustrated) formed on one principle side beforehand as with the vibration plate 12, was irradiated with a laser beam and cut to a specified shape to obtain a frame 14. Next, the frame 14 was adhesively attached on one principle side 12F of the vibration plate 12, while a second frame 26*a* was adhesively attached on the other principle side 12B of the vibration plate 12. Next, a piezoelectric element 11 was adhesively attached on the other principle side 12B of the vibration plate 12 in a manner enclosed by the second frame 26. Next, a terminal 15 was adhesively attached on the other principle side 12B of extension parts 12*a*, 12*b* of the vibration plate 12. Next, a cover plate 26*b* was adhesively attached on the second frame 26*a*. Next, conductive resin paste was applied in a band shape on the one principle side 12F of the vibration plate 12 obtained above, using the screen printing method and covering the area from the first opening 13*a*1 to the second opening 13*a*2, while at the same time conductive resin paste was similarly applied in a band shape covering the area from the first opening 13*b*1 to the second opening 13*b*2, after which the paste was cured at 150° C. to form lead conductors 18*a*, 18*b* constituted by a conductive resin layer. Next, a second cover 27 was adhesively attached on the frame 14 in a manner covering the one principle side 12F of the vibration plate 12 to obtain a piezoelectric sound-generating device 20.

INDUSTRIAL FIELD OF APPLICATION

The present invention is suitable for piezoelectric sound-generating bodies used for small speakers, etc., installed in slim electronic devices, mobile electronic devices, etc.

The invention claimed is:

1. A piezoelectric sound-generating device of a square shape, said piezoelectric sound-generating device characterized by comprising:

a vibration plate having a main square area in which multiple first openings are formed, and multiple extension parts on which second openings are formed and which are projecting from an outer periphery of the main area;

a frame having a rim that circularly supports a vicinity of a continuous outer periphery of the main area and extension parts of the vibration plate, adhesively attached on one principle side of the vibration plate;

a square bimorph piezoelectric element having multiple surface electrodes formed in positions corresponding to the first openings on the one principle side of the vibration plate, adhesively attached in the main area on the other principle side of the vibration plate;

a terminal having an insulative substrate and terminal electrodes formed on one principle side of the substrate, adhesively attached on the other principle side of the extension parts of the vibration plate; and multiple lead conductors formed on the one principle side of the vibration plate, respectively, from the surface electrodes of the piezoelectric element exposed in the first openings, to the terminal electrodes of the terminal exposed in the second openings.

2. A piezoelectric sound-generating device according to claim 1, characterized by further comprising a first cover on the other principle side of the vibration plate in a manner covering the other principle side of the piezoelectric element while also forming a ventilation hole.

3. A piezoelectric sound-generating device according to claim 1, characterized by further comprising a second cover on the frame in a manner covering the one principle side of the vibration plate while also forming a ventilation hole.

4. A piezoelectric sound-generating device according to claim 1, characterized in that the frame has projections extending from the rim, with edges projecting into an area overlapping with the piezoelectric element across the vibration plate.

5. A piezoelectric sound-generating device according to claim 1, characterized in that the vibration plate is made of a rubber sheet.

6. A piezoelectric sound-generating device according to claim 2, characterized by further comprising a second cover on the frame in a manner covering the one principle side of the vibration plate while also forming a ventilation hole.

7. A piezoelectric sound-generating device according to claim 1, wherein top surfaces of the terminal electrodes are leveled with top surfaces of the surface electrodes, constituting a plane on which the vibration plate is placed.

8. A piezoelectric sound-generating device according to claim 1, wherein the vibration plate has four general peripheral sides, and the extension parts are disposed at one of the peripheral sides.

9. A piezoelectric sound-generating device according to claim 1, wherein the vibration plate has four general peripheral sides, and the extension parts are disposed at two opposite sides of the peripheral sides.

* * * * *